United States Patent
Nordahl

(10) Patent No.: US 9,915,756 B2
(45) Date of Patent: Mar. 13, 2018

(54) LARGE AREA FORMAT SAPPHIRE WINDOWS VIA TRANSIENT LIQUID PHASE BONDING

(71) Applicant: RAYTHEON COMPANY, Waltham, MA (US)

(72) Inventor: Christopher S. Nordahl, Chelmsford, MA (US)

(73) Assignee: RAYTHEON COMPANY, Waltham, MA (US)

( * ) Notice: Subject to any disclaimer, the term of this patent is extended or adjusted under 35 U.S.C. 154(b) by 3 days.

(21) Appl. No.: 14/811,305

(22) Filed: Jul. 28, 2015

(65) Prior Publication Data

US 2017/0031057 A1 Feb. 2, 2017

(51) Int. Cl.
*G02B 1/02* (2006.01)
*C30B 33/06* (2006.01)
*C03C 10/00* (2006.01)

(52) U.S. Cl.
CPC ............ *G02B 1/02* (2013.01); *C03C 10/0036* (2013.01); *C30B 33/06* (2013.01); *C04B 2237/062* (2013.01); *C04B 2237/064* (2013.01); *C04B 2237/343* (2013.01); *C04B 2237/60* (2013.01); *C04B 2237/78* (2013.01)

(58) Field of Classification Search
None
See application file for complete search history.

(56) References Cited

U.S. PATENT DOCUMENTS

| | | | | |
|---|---|---|---|---|
| 1,966,408 A | * | 7/1934 | Hauman | C04B 35/195 501/119 |
| 3,678,570 A | | 7/1972 | Paulonis et al. | |
| 3,859,714 A | * | 1/1975 | DeLuca | C30B 29/20 156/89.12 |
| 4,005,988 A | | 2/1977 | Paulonis et al. | |
| 4,973,564 A | * | 11/1990 | Chyung | C03C 8/24 428/312.6 |
| 6,012,303 A | | 1/2000 | Axelson et al. | |
| 6,663,736 B1 | | 12/2003 | Ardini et al. | |

* cited by examiner

*Primary Examiner* — Stephone B Allen
*Assistant Examiner* — James McGee
(74) *Attorney, Agent, or Firm* — Lando & Anastasi, LLP

(57) ABSTRACT

A method for forming an optical window. In one example, the method includes depositing a layer of eutectic bonding material onto a first surface of a first section of window material, positioning a second surface of a second section of window material onto the layer of eutectic bonding material such that the first surface is disposed opposite the second surface, and heating the eutectic bonding material to a temperature above a eutectic temperature of the eutectic bonding material and below a melting temperature of the window material for a predetermined length of time to form an optical window. The window material of the first section and the second section may be transparent to infrared radiation and comprise aluminum.

20 Claims, 18 Drawing Sheets

| Typical EM Window Materials | | | | |
| --- | --- | --- | --- | --- |
| | Specification | Sapphire | Spinel | AlON |
| Single pane dimensions | 57 in. x 35 in. | 16 in. x 18 in. x 1 in. | 12 in. x 17.5 in. x 0.5 in. | 19 in. x 29 in. x 1 in. |
| Demonstrated bond length | N/A | 13 in. (c-plane) 8 in. (m-plane) | 18 in. | |
| Relative thickness | N/A | 1X | 2X | 1.5X |
| Transmittance | >68% | 71% | 71% | 40% |
| Cost | N/A | 4X | 8X | TBD |

FIG. 1

LARGE AREA FORMAT SAPPHIRE WINDOWS VIA TRANSIENT LIQUID PHASE BONDING

BACKGROUND

Sapphire windows generally exhibit extreme hardness, high thermal conductivity, and resistance to common chemical acids and alkalis. Chemically, sapphire is single crystal aluminum oxide ($Al_2O_3$). Synthetic sapphire can be produced industrially from agglomerated aluminum oxide, which is sintered and fused in an inert atmosphere. Sapphire is the second hardest crystal next to diamonds, and because of its structural strength, can be made much thinner than other common windows with the added benefit of improved transmittance.

Sapphire is often used for shatter resistant windows and various military body armor suits. Sapphire glass, which is highly transparent to wavelengths of light between 150 nm and 5500 nm, is crystalline sapphire used as an optical window or cover. Some windows are made from sapphire boules that have been grown in a specific crystal orientation, typically along the optical, or c-axis, for minimum birefringence. Sapphire boules are sliced into a desired window thickness and are polished to the desired surface finish. Sapphire windows are used in high pressure chambers for spectroscopy, crystals in various watches, and windows in grocery store barcode scanners. They are also used as end windows on high-powered laser tubes as their wide-band transparency and thermal conductivity allow them to handle very high power densities in the infrared and ultraviolet (UV) spectrum without degrading due to heating.

Sapphire glass is typically manufactured in panes up to 16 inches×18 inches×1 inch. Sapphire is limited in the dimensions that can be achieved in a single crystal. In general, there is an increasing need for larger format sapphire windows for applications such as naval technology. For instance, a destroyer is a fast maneuverable long-endurance warship intended to escort larger vessels in a fleet, convoy, or battle group and defend them against smaller powerful short-range attackers. Destroyers comprise Component Electro-optic Window Enclosures (CEWEs) having dimensions of, for instance, about 57"×39". Similarly, infrared search and track (IRST) pods and joint strike fighter (JSF) surveillance windows have a need for large area format shaped windows.

Currently, multiple panes of sapphire can be tiled together using mullions—vertical elements that form a division between units of a window—to hold the panes in place. However, the mullions are typically made of metal and will scatter and obscure views of the optics located behind the sapphire windows. Glass frit bonding has also been investigated for holding panes together. The glass frit bonding procedure forms a thin glass mixture at the interface, which bonds the panes together. The window is only as strong as the glass phase holding the panes together, which may compromise the mechanical integrity of the window. Further, optical bonding, where the bonds are optically polished to a tenth wave flatness and then contacted and heat treated to form monolithic windows, has been employed. However, optical bonds are limited in scale to what can feasibly be ground and polished to a tenth wave flatness. Currently, a 13 inch bond length is the maximum.

SUMMARY OF INVENTION

Aspects and embodiments relate generally to large area format sapphire windows, and more particularly, to large area format sapphire windows created by a transient liquid phase bonding process.

According to one embodiment, a method of forming an optical window includes depositing a layer of eutectic bonding material onto a first surface of a first section of window material, positioning a second surface of a second section of window material onto the layer of eutectic bonding material such that the first surface is disposed opposite the second surface, the window material of the first section and the second section being transparent to infrared radiation and including aluminum, and heating the eutectic bonding material to a temperature above a eutectic temperature of the eutectic bonding material and below a melting temperature of the window material for a predetermined length of time to bond the first and second sections together to form an optical window.

In one example, the eutectic bonding material is aluminosilicate. The bonding material may be calcium alumino silicate.

In one example, the window material is at least one of Spinel, AlON, sapphire, YAG, Nd:YAG, and SiAlON. The window material may be sapphire. In one example, the window material is c-plane sapphire. In one example, the window material method further comprises aligning the crystal orientation of the window material of the first section to the crystal orientation of the window material of the second section. In one example, the window material is a-plane sapphire.

In one example, the first surface and the second surface are as-ground surfaces.

In one example, the heating causes at least a portion of the aluminum in the window material to diffuse into an interface between at least one of the first section of window material and the eutectic bonding material and the second section of window material and the eutectic bonding material. In one example, the aluminum diffuses in the form of crystalline needles.

In one example, the temperature is in a range of 1275-1350° C. and the predetermined length of time is about 18 hours.

In one example, the method further comprises positioning and heating at least two sections to form a large area format optical window having a size of at least 14 inches×28 inches.

In one example, the second section of window material is positioned orthogonally relative to the first section of window material.

In one example, the formed optical window can withstand a tensile load of at least 8 psi.

In one example, the first surface and the second surface are edge surfaces of the first section of window material and the second section of window material, respectively.

According to another embodiment, an optical window comprises a first section of window material having a first surface, a second section of window material having a second surface, the window material of the first section and the window material of the second section being transparent to infrared radiation and comprising aluminum, and at least one layer of eutectic bonding material disposed between the first surface and the second surface, wherein the first surface is bonded to the second surface using a transient liquid phase bonding process.

In one example, at least a portion of the aluminum in the window material is integrated into an interface between at least one of the first section of the window material and the eutectic bonding material and the second section of window material and the eutectic bonding material.

In one example, the eutectic bonding material is an aluminosilicate. The aluminosilicate can be calcium aluminosilicate.

In one example, the window material is at least one of Spinel, AlON, sapphire, YAG, Nd:YAG, and SiAlON. The window material may be sapphire. In one example, the window material is c-plane sapphire or a-plane sapphire.

In one example, the two or more sections of window material for a large are format optical window having a size of at least 14 inches by 28 inches.

In one example, the optical window can withstand a tensile load of at least 8 psi.

Still other aspects, embodiments, and advantages of these example aspects and embodiments are discussed in detail below. Moreover, it is to be understood that both the foregoing information and the following detailed description are merely illustrative examples of various aspects and embodiments, and are intended to provide an overview or framework for understanding the nature and character of the claimed aspects and embodiments. Embodiments disclosed herein may be combined with other embodiments, and references to "an embodiment," "an example," "some embodiments," "some examples," "an alternate embodiment," "various embodiments," "one embodiment," "at least one embodiment," "this and other embodiments," or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide an illustration and a further understanding of the various aspects and embodiments, and are incorporated in and constitute a part of this specification, but are not intended as a definition of the limits of any particular embodiment. The drawings, together with the remainder of the specification, serve to explain principles and operations of the described and claimed aspects and embodiments. In the figures, each identical or nearly identical component that is illustrated in various figures is represented by a like numeral. For purposes of clarity, not every component may be labeled in every figure. In the figures:

FIG. 1 is a table of candidate glass components according to aspects of the invention;

DETAILED DESCRIPTION

Figure 2:
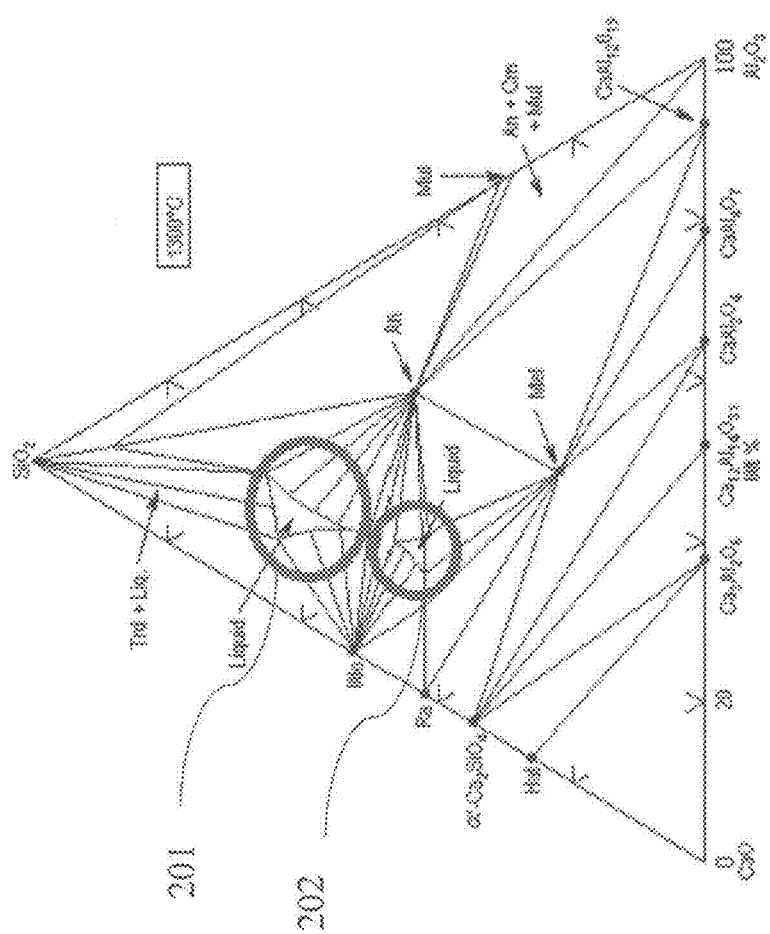
FIG. 2 is a phase diagram of a calcium aluminosilicate glass system according to aspects of the invention.

Aspects and embodiments relate to systems and methods for providing large area format sapphire windows, and more particularly, to large area format sapphire windows created by a transient liquid phase bonding process. In some embodiments, the sapphire windows are used to protect electro-optic equipment, such as lasers.

Typical sapphire panes are available in 16 in.×18 in. dimensions, and typical edge bonding requires precise grinding and polishing. As described in more detail below, however, according to the systems and methods disclosed herein, large area format sapphire windows may be joined together to create an optical window without the use of mullions, which impair the functionality of optical equipment positioned behind the glass. The disclosed bonding process uses as-ground window materials that contain aluminum and joins them together using a transient liquid phase bonding process that includes a eutectic bonding material. As noted, the disclosed process requires no edge optical polishing prior to edge bonding. Further, the large area format sapphire windows may have greater than 68% transmittance, and may be able to withstand a tensile load of at least 8 psi.

The aspects disclosed herein in accordance with the present invention, are not limited in their application to the details of construction and the arrangement of components set forth in the following description or illustrated in the accompanying drawings. These aspects are capable of assuming other embodiments and of being practiced or of being carried out in various ways. Examples of specific implementations are provided herein for illustrative purposes only and are not intended to be limiting. In particular, acts, components, elements, and features discussed in connection with any one or more embodiments are not intended to be excluded from a similar role in any other embodiments.

Also, the phraseology and terminology used herein is for the purpose of description and should not be regarded as limiting. Any reference to examples, embodiments, components, elements, or acts of the systems and methods herein referred to in the singular may also embrace embodiments including a plurality, and any references in plural to any embodiment, component, element, or act herein may also embrace embodiments including only a singularity. References in the singular or plural form are not intended to limit the presently disclosed systems of methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described items. In addition, in the event of inconsistent usages of terms between this document and documents incorporated herein by reference, the term usage in the incorporated reference is supplementary to that of this document; for irreconcilable inconsistencies, the term usage in this document controls. Moreover, titles or subtitles may be used in the specification for the convenience of a reader, which shall have no influence on the scope of the present invention.

Properties of Candidate Window Materials

According to at least one embodiment, a window is provided that is constructed from one or more window materials. According to some embodiments, the window material comprises aluminum. In accordance with at least one embodiment, the window material is at least one of Spinel ($MgAl_2O_4$), AlON (aluminum oxynitride), sapphire, yttrium aluminum garnet (YAG) ($Y_3Al_5O_{12}$), neodymium-doped YAG (Nd:YAG), polycrystalline aluminum oxide and silicon aluminum oxynitride (SiAlON). According to some embodiments, the window material is sapphire. As used herein, the term "sapphire" refers to sapphire or a sapphire glass material, such as aluminum oxide or alumina ($Al_2O_3$ or $\alpha$-$Al_2O_3$) material. Sapphire may include natural sapphire materials found naturally, or synthetic sapphire materials, such as those formed by any of the Kyropoulos, Stepanov, Czochralski, Bagdasarov, or Verneuil processes. In accordance with certain embodiments, the window material is c-plane sapphire. According to other embodiments, the window material is a-plane sapphire.

A table of potential aluminum-based window materials and their physical properties that are capable of bonding with a eutectic material to form a larger window is shown in FIG. 1. As can be seen in FIG. 1, single panes of sapphire and spinel monolithic plates do not currently meet the dimension requirements of about 57 inches×about 35 inches for certain military applications, and therefore have to be joined together to form the requisite size. Sapphire is considered to be a desirable candidate for the disclosed transient liquid phase bonding process, since it exhibits an acceptable transmittance, has a relatively low cost, and has low relative thickness. Current bonding approaches, including the use of mullions and glass frit bonding, require expensive polishing, optical contacting, and diffusion bonding. The disclosed transient liquid phase bonding process is limited only by the size of the equipment and the process offers significantly reduced costs.

Eutectic Bonding Material

According to various embodiments, a eutectic bonding material is heated to a temperature above a eutectic temperature of the eutectic bonding material and below a melting temperature of the window material for a predetermined length of time. As used herein, the term "eutectic bonding material" refers to a composition of at least two constituents that melts substantially completely to form a single liquid at a temperature below the melting point of any of the constituents. According to some embodiments, the eutectic bonding material is a low temperature eutectic glass or alloy. According to one embodiment, the eutectic bonding material is an aluminosilicate. The eutectic bonding material may be an aluminosilicate wherein a third or more constituent is selected from the Group IIA elements. In some embodiments, the eutectic bonding material may comprise group IIIA elements in addition to Al. In some embodiments, the eutectic bonding material may comprise group IVA elements in addition to Si. Non-limiting examples of aluminosilicate materials include aluminum silicate, calcium aluminosilicate, sodium aluminosilicate, magnesium aluminosilicate, and potassium aluminosilicate. According to one embodiment, the eutectic bonding material is calcium aluminosilicate (CAS, $CaAl_2Si_2O_8$).

FIG. 2 is a graph showing a ternary phase diagram of a calcium aluminosilicate system at an isotherm of 1300° C. The ternary phase diagram shows various ternary phases present inside the triangle and binary phases along the sides. The eutectic points 201, 202 indicate compositions at which liquid phases of this system are present. A low amount of CaO leads to the formation of the liquid phase at about 1300° C.

Method of Manufacture

According to some embodiments, a method for producing large area format sapphire windows using transient liquid phase bonding is provided. Use of the liquid phase bonding allows the use of as-ground surfaces, significantly reducing the cost of fabrication. As used herein, the term "as-ground" refers to a surface of a window material that has not been subjected to optical polishing beyond any initial polishing or grinding performed on window material that has been either manufactured or mined. Initial polishing or grinding processes may include the Blanchard process, or rotary surface grinding, which is used to generate a flat surface. The flat surface may have a 60/80 scratch dig rating using a diamond wheel. A scratch is any marking or tearing of the part surface. A dig is a small rough spot on the part surface similar to a pit in appearance. A dig may be, for example, a bubble. The size of the scratches and digs may be measured with an optical comparator, and surface quality may be specified by a number, for example, 60/80. The first digit relates to the maximum width allowance of a scratch as measured in microns. The next digit indicates the maximum diameter allowance for a dig in hundredths of a millimeter. A surface quality callout of 60/80 would permit a scratch width of 0.06 mm and a dig diameter of 0.80 mm. In some embodiments, a boron carbide rough grind may be applied. For example, a 400 grit boron carbide rough grind may be applied. One of the advantages of the disclosed optical window system and method is that the surfaces of the individual panels or sheets of window material that are to be bonded to each other do not have to be ground or polished, and therefore do not have to adhere to having a flatness of $\lambda/3$-$\lambda/10$, as is the case in typical bonding methods.

Figure 10:
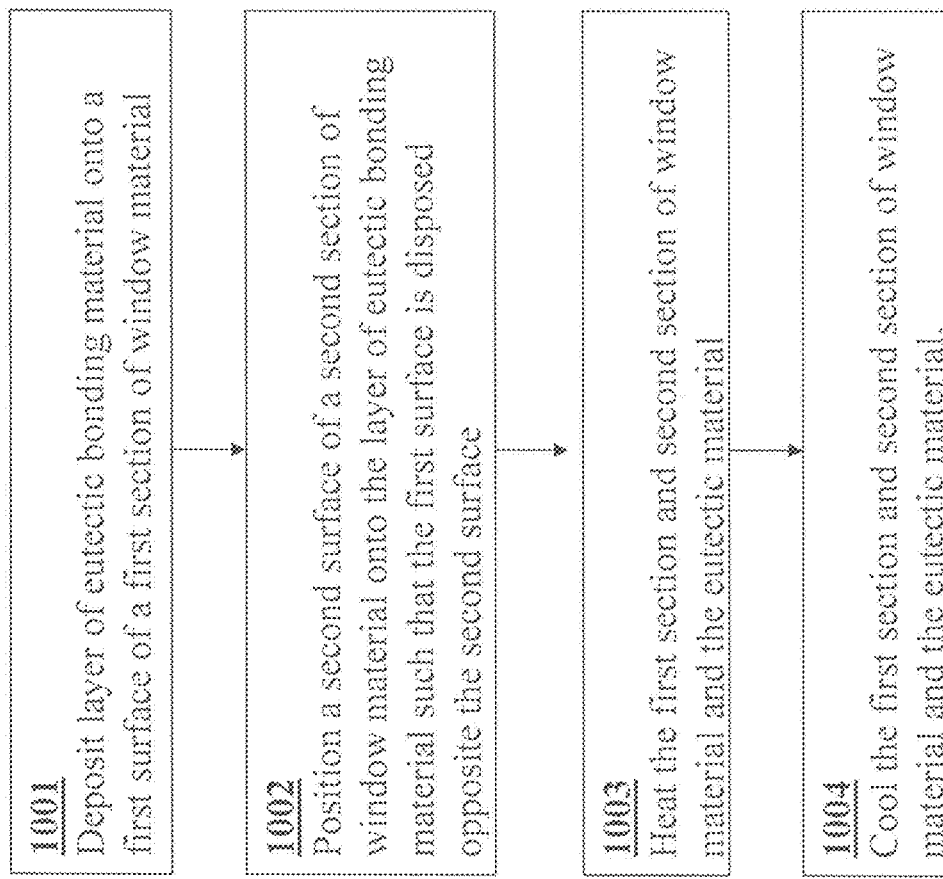
FIG. 10 is a flow diagram of one example of a method of forming an optical window according to aspects of the invention.

According to certain embodiments, as illustrated in FIG. 10, the transient liquid phase bonding process comprises depositing a layer of eutectic bonding material onto a first surface of a first section of window material (step 1001). For example, the eutectic bonding material may be placed on one or more edge surfaces of a window material. In some embodiments, the eutectic bonding material may be placed on a flat face surface of a window material, such as the surface that forms the viewing pane when installed as a window. According to some embodiments, the process further comprises positioning a second surface of a second section of window material onto the layer of eutectic bonding material such that the first surface is disposed opposite the second surface (step 1002). The first section of window material and the second section of window material may be positioned in any orientation relative to each other. In one embodiment, the edge of the first section of window material may align with the edge of the second section of window material. In another embodiment, the flat face of the first section of window material may align with the flat face of the second section of window material, thereby creating a "sandwich" effect.

The transient liquid phase has a eutectic temperature where the eutectic bonding and window materials are mutually soluble. In accordance with some embodiments, the window materials and the eutectic bonding material are heated to a temperature that is above the eutectic temperature for a predetermined length of time (step 1003). According to some embodiments, the predetermined length of time is about 18 hours. According to some embodiments, the temperature is in a range of 1275-1350° C.

In one embodiment, an amorphous calcium aluminosilicate glass powder is used. Amorphous calcium aluminosilicate glass powders are functional fillers and extenders produced from post-industrial low alkali glass feedstocks. Amorphous calcium aluminosilicate powders are fully amorphous and contain no crystalline silica. Amorphous calcium aluminosilicate glass powder is inert, and resistant to blooming, blistering, and chemical degradation in harsh environments. Amorphous calcium aluminosilicate glass particles are transparent, angular-shaped particles with similar dimensions in the x, y, and z axis. An amorphous calcium aluminosilicate glass powder having a median particle size of 6-7 μm is ball milled overnight in methanol with Darvan C, a dispersant. The glass is applied using a miniature paint sprayer and is allowed to dry. The sprayed surfaces may be bonded using only gravity.

In some embodiments, a priming process may be performed prior to the bonding process. For example, the priming process may include priming the surfaces by first heating the surfaces to about 1200° C. to melt and glaze the surfaces to be bonded. In another embodiment, weight can be applied to the bonds. For example, weight may be applied to the bonds by either static loading or clamping. Heating and cooling rates associated with the process may be about 5° C./min. A temperature range of about 1200° C. to about 1400° C. may be used. According to some embodiments, the process is optimized at 1275° C. and 1300° C. Air atmosphere furnaces with a maximum temperature of 1500° C. may be used. For example, Lindberg Blue furnaces may be used. As noted above, according to various aspects, the window material comprises aluminum.

In accordance with at least one embodiment, heating to a temperature that is above the eutectic temperature causes aluminum to diffuse from the window material and into an interface between the window material and the eutectic bonding material. Thus, the aluminum material diffuses across the boundary of the bond, thereby allowing the interfaces to "stitch" together. In some embodiments, the diffused material is referred to as a "needle." In some embodiments, the diffused material is referred to as a "whisker." These needles nucleate from the as-ground surface of the sapphire and extend into the glass bonding region. In order to be effective, the needles should extend at least half the thickness of the bonding region. This length ensures the "zipping" or "stitching" of the needles in the bonded region, which increases the strength of the bond. The window material then crystallizes upon cooling (step 1004).

The final composition of the bonded region may be similar to the starting composition. The eutectic glass provides a medium for which the Al atoms migrate from the as-ground surface to the nucleating needles. Upon cooling down through the eutectic, the liquid solidifies as the starting glass. Without being bound by theory, it is believed that the improved strength of the bond is a result of the interpenetrating needles. The strength of the bond may be greater than that of the pure glass, but not as strong as the sapphire monolithic strength. The advantage comes from a thinner window material than that which is bonded by glass alone, but may need to be thicker than monolithic sapphire.

In accordance with some embodiments, a second section of window material may be positioned orthogonally relative to a first section of window material, and the two orthogonal planes of sapphire may be bonded together. According to various embodiments, two or more tiles of sapphire may be bonded to produce a large area format sapphire window. For example, according to some embodiments, two or more sections of the window material may be positioned and bonded together to form a large area format optical window having a size of at least about 14 inches×about 28 inches. For example, two or more sections of window material may be joined together to create an optical window having dimensions of about 57 inches×about 39 inches. These dimensions fulfill an existing need on, for example, CEWE windows for Naval destroyers. Due to the stitching of the interfaces of the bonds, the mechanical integrity of the bond is much greater than the strength of the glass frit used in typical processes for bonding multiple sections of sapphire together.

According to some embodiments, the optical window formed from the processes disclosed herein is capable of withstanding a tensile load of at least 8 psi. In accordance with certain embodiments, the formed optical window exhibits 60% of the strength exhibited by a comparable homogenous window formed of the same material. For example, a large-area format sapphire window formed from the processes disclosed herein may have 60% of the strength relative to an equivalent window formed from homogeneous sapphire. According to at least one embodiment, the window materials used in the bonding process are transparent to infrared radiation.

EXAMPLES

The systems and methods described herein will be further illustrated through the following examples, which are illustrative in nature and are not intended to limit the scope of the disclosure.

Example 1: C-Plane Bonding Region

To construct and test the behavior and physical properties of a c-plane crystal sapphire window, window material and eutectic material were prepared and combined as discussed above. Due to the crystalline structure of single crystal sapphire, sapphire sheets may be formed in various planar orientations including c-plane, m-plane, r-plane, and a-plane. C-plane single crystal sapphire has homogenous properties that may provide advantages over other orientations. As used herein, the term "c-plane single crystal sapphire" refers to substantially planar single crystal sapphire, the c-axis of which is substantially normal (±10°) to the major planar surface of the material. Typically, the c-axis is less than about 1° from the major planar surface. The sapphire c-plane is as is known in the art and is typically the sapphire plane having a Miller index of 0001 and d-spacing of 2.615 Angstroms.

Figure 3A:
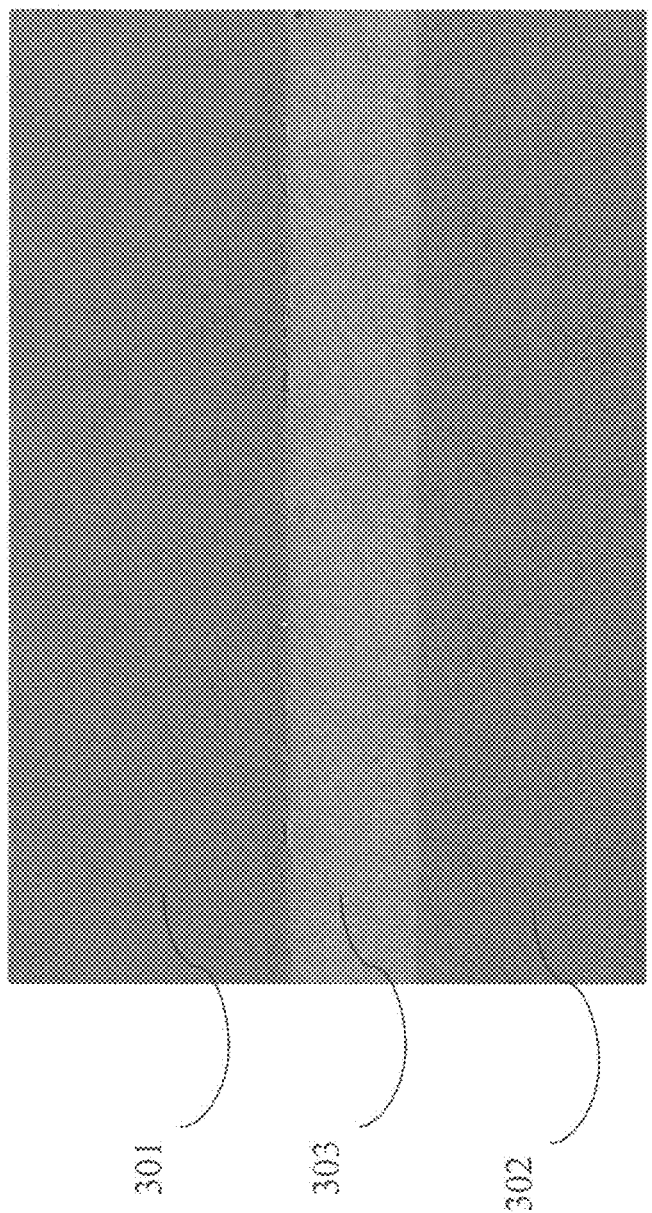
FIGS. 3A and 3B feature two c-plane sapphire bonding region images after exposure to 1275° C. for 20 hours.
Figure 3B:

As shown in FIG. 3A at 1,000 times magnification and FIG. 3B at 5,000 times magnification, window materials 301 and 302 are bonded to eutectic material 303. Eutectic material 303 has a thickness of about 40 μm. Window materials 301 and 302 comprise c-plane crystal sapphire. According to this example, the eutectic material 303 comprises calcium aluminosilicate. The process used for the window materials 301 and 302 and eutectic material 303 featured in FIGS. 3A and 3B included heating to 1275° C. for a time duration of 20 hours. As shown in FIGS. 3A and 3B, crystalline needles appear to be nucleating from window materials 301 and 302 into eutectic material 303.

Figure 4A:
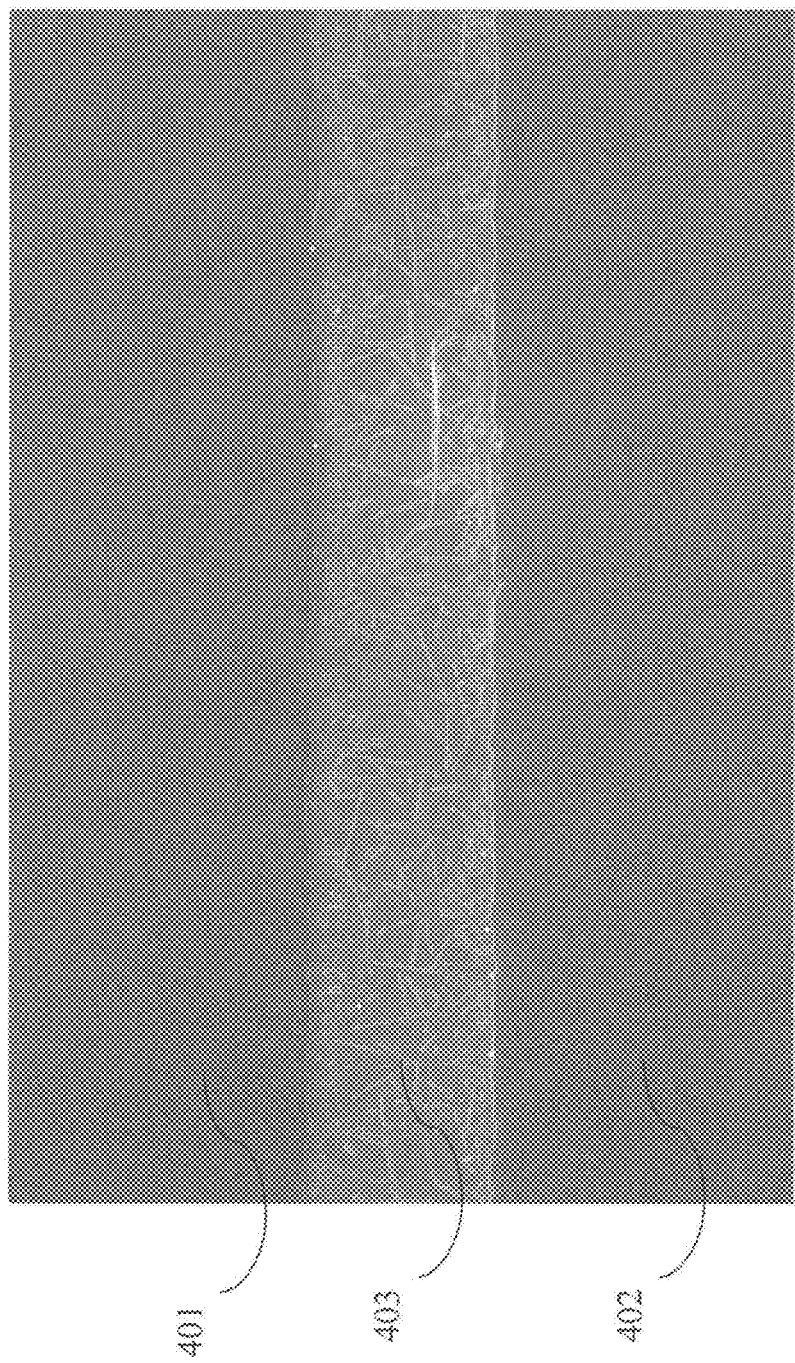
FIGS. 4A and 4B feature two c-plane sapphire bonding region images after exposure to 1275° C. for 20 hours and subsequent HF etching.
Figure 4B:
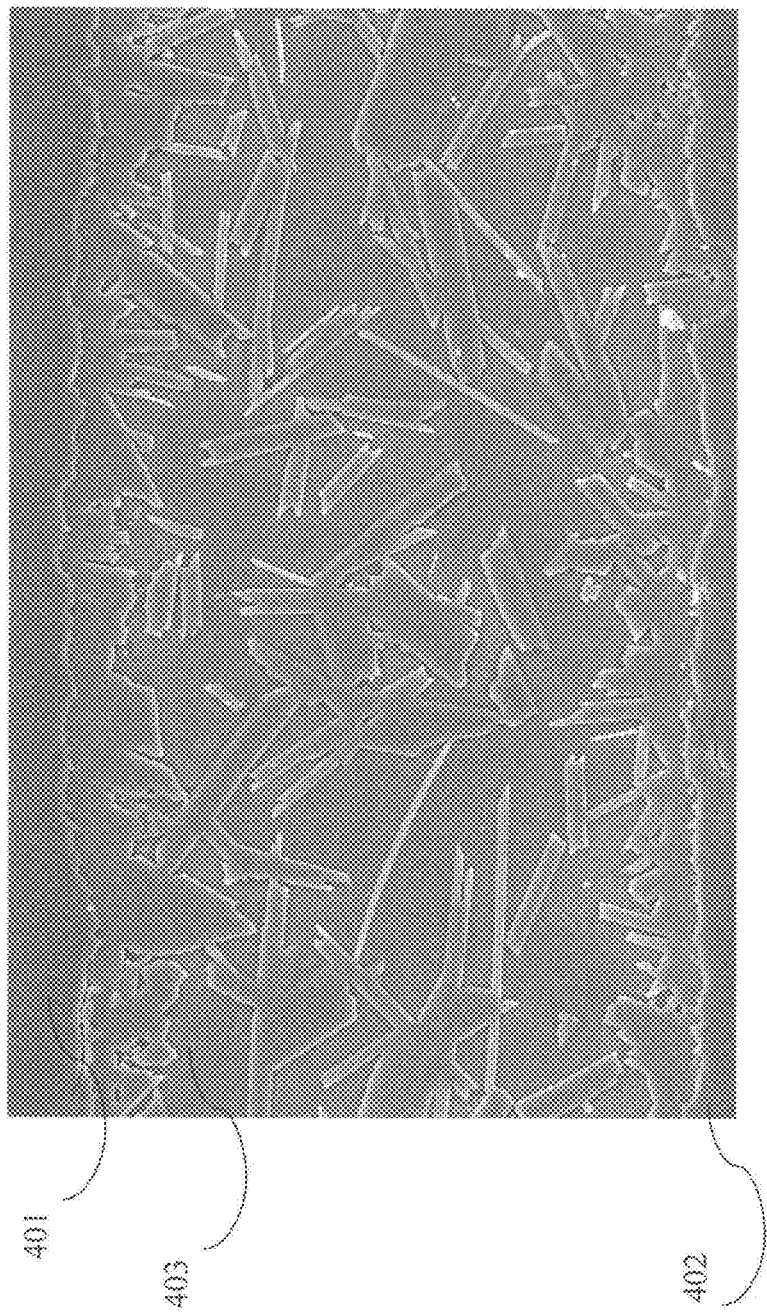

Referring to FIG. 4A at 1,000 times magnification and FIG. 4B at 4,000 times magnification, c-plane crystal sapphire window materials 401 and 402 are also bonded to a calcium aluminosilicate eutectic material 403. Eutectic material 403 has a thickness of about 40 μm. The process used to form the optical window shown in FIGS. 4A and 4B included heating window materials 401 and 402 and eutectic material 403 to 1275° C. for 20 hours, and then etching with hydrofluoric acid. The etching process may comprise applying acid to the window material with a swab, allowing the window material to sit for a predetermined length of time, and rinsing the window material with deionized water. The etching process is such that the acid only attacks the glass phase, not the sapphire, and results in increased resolution and definition of the images.

Figure 5A:
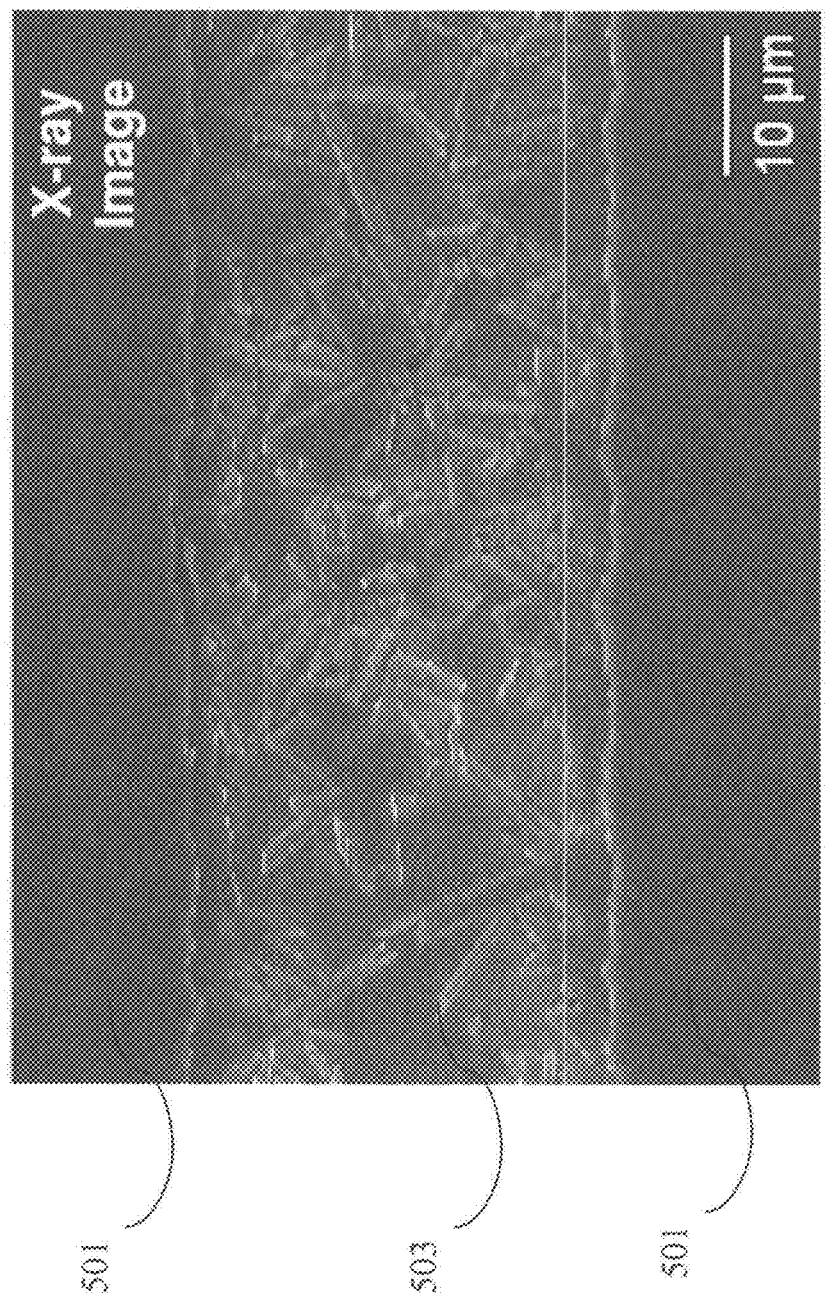
FIG. 5A features a c-plane sapphire bonding region x-ray image after exposure to 1275° C. for 20 hours and subsequent HF etching.
Figure 5B:
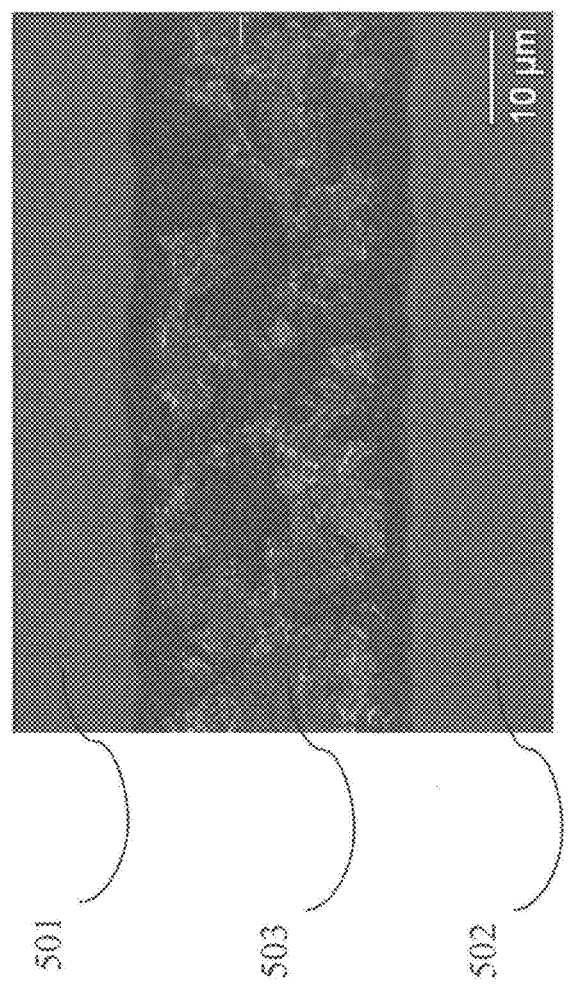
FIG. 5B features an aluminum map of a c-plane sapphire bonding region x-ray image after exposure to 1275° C. for 20 hours and subsequent HF etching.
Figure 5C:
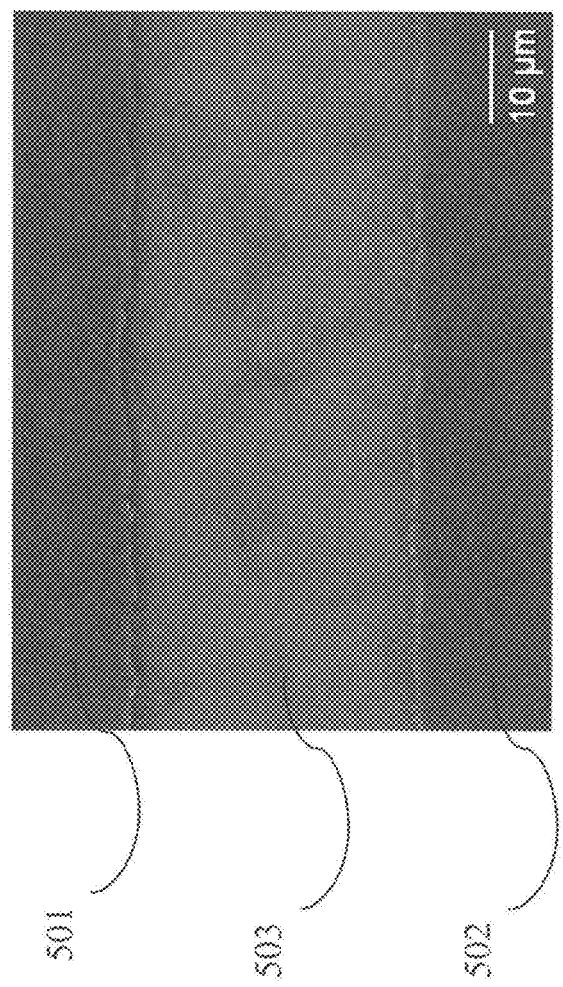
FIG. 5C features a calcium map of a c-plane sapphire bonding region x-ray image after exposure to 1275° C. for 20 hours and subsequent HF etching.

After etching, the extent of the formation of crystalline needles is more apparent than prior to etching, as shown by comparing FIGS. 3A and 3B to FIG. 4A to FIG. 4B. X-ray mapping of the bonded region, as shown in FIGS. 5A, 5B, and 5C, indicates that the crystalline needles are rich in aluminum and deficient in calcium. This allows for confirmation that the needles are indeed sapphire needles. The magnification, and thus the bond thickness of about 40 μm is the same in both figures. The x-ray map confirms that needles nucleate from the as-ground surface into the bonded region, and do not merely float in the bonded region. The needles provide enhanced strength in the bonded region in comparison to an only glass bonded interface.

Figure 6A:
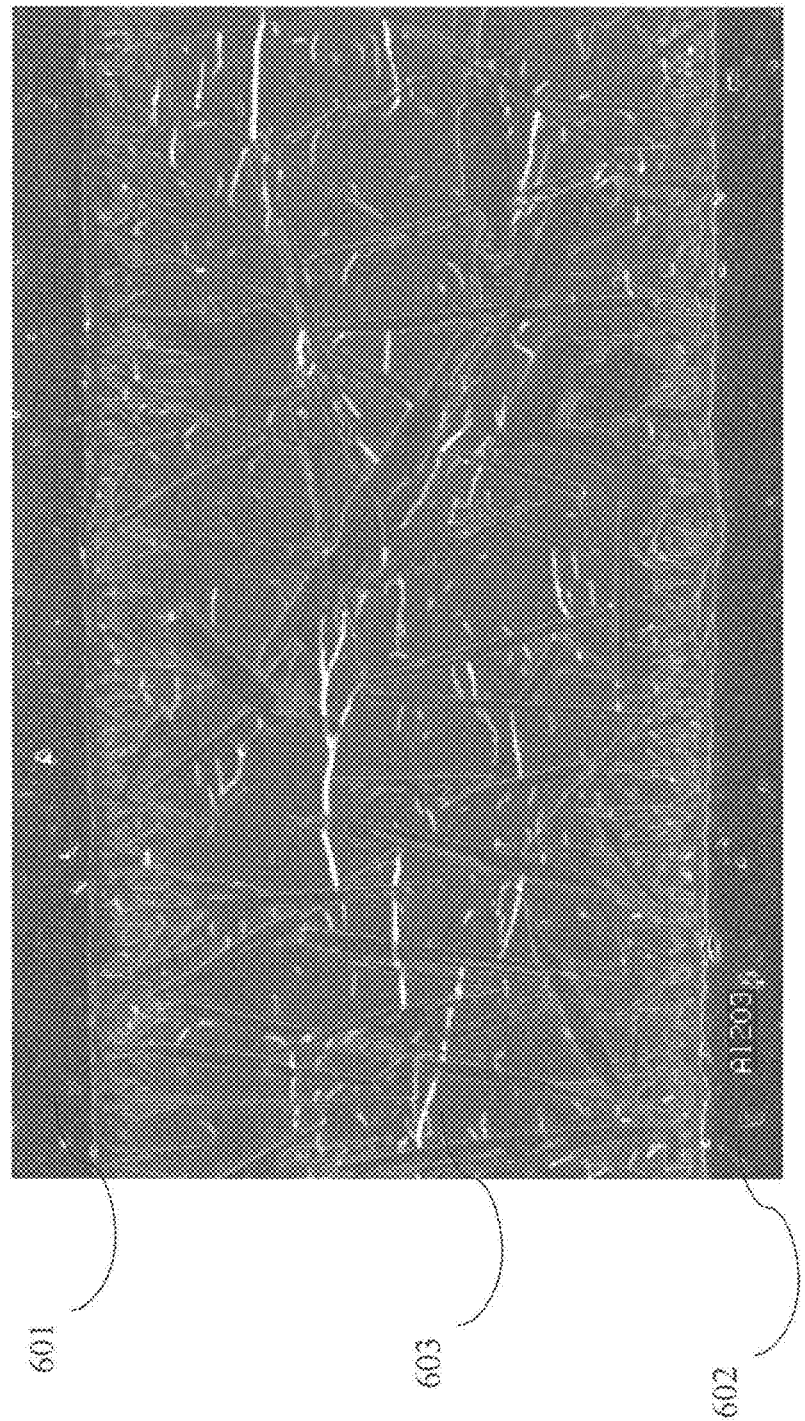
FIGS. 6A and 6B feature two c-plane sapphire bonding region images after exposure to 1300° C. for 20 hours and subsequent HF etching.
Figure 6B:
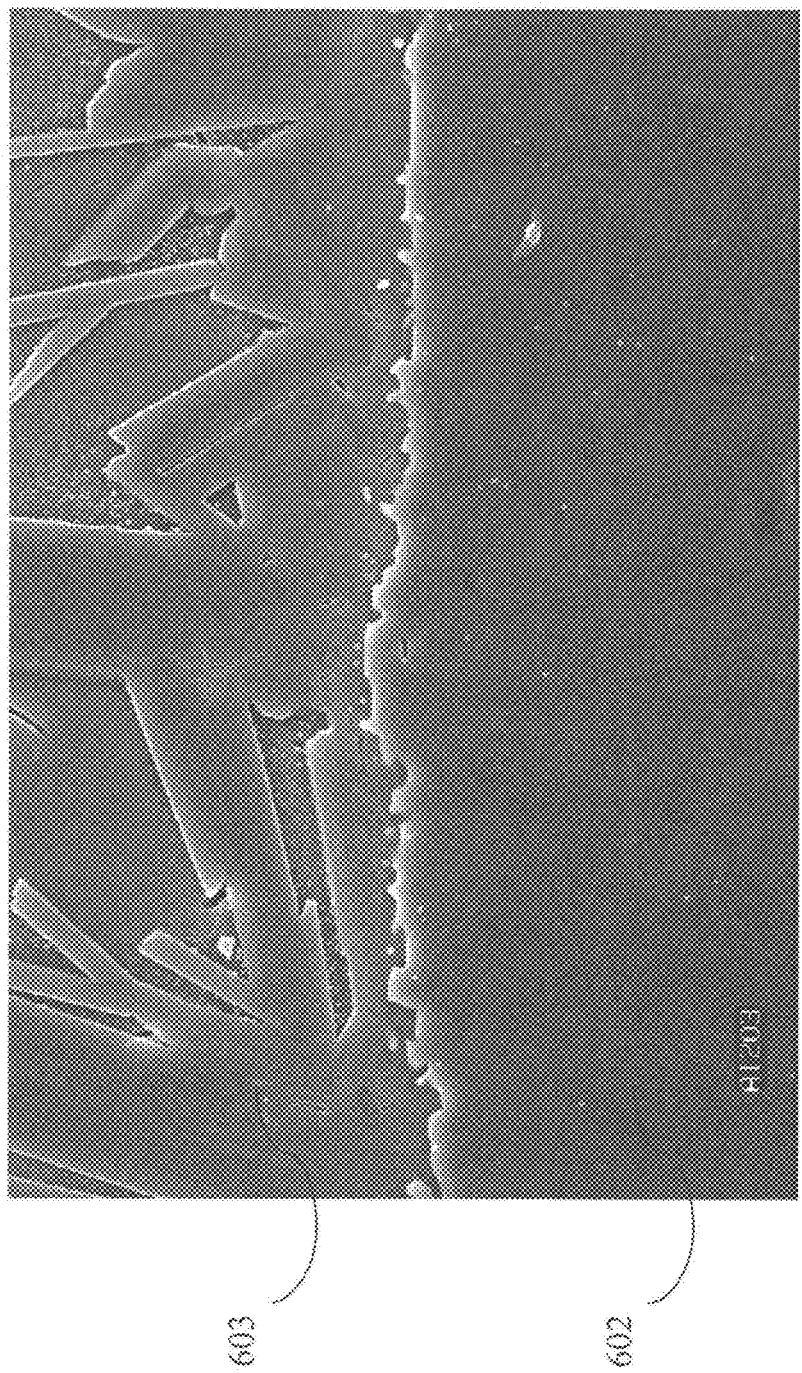

C-plane crystal sapphire window materials were then bonded to eutectic materials at a temperature of 1300° C. instead of 1275° C. for 20 hours, and then etched with hydrofluoric acid. The results of this processing are shown in FIG. 6A at 1,000 times magnification and FIG. 6B at 10,000 times magnification, where it is evident that at the higher temperature there is significantly more needle growth and interpenetration. This indicates that the glass adheres well with the as-ground surfaces. No additional flattening or polishing of the window surfaces was required. The bonded region grows in thickness at the higher temperatures as more aluminum from the sapphire panes is transported to the nucleating needles, resulting in a bonded region of about 200 μm in thickness. The amount of glass remains the same, but the stitching region increases in volume.

Figure 7A:
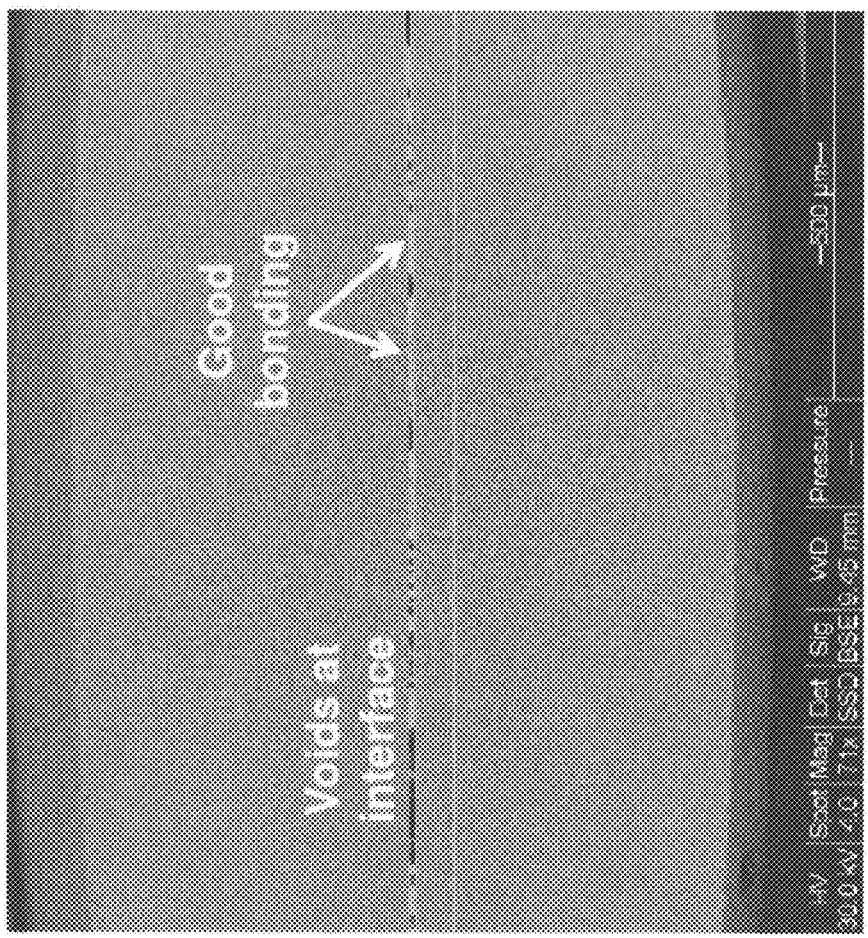
FIGS. 7A and 7B feature two c-plane sapphire bonding region images after exposure to 1350° C. for 18 hours.
Figure 7B:
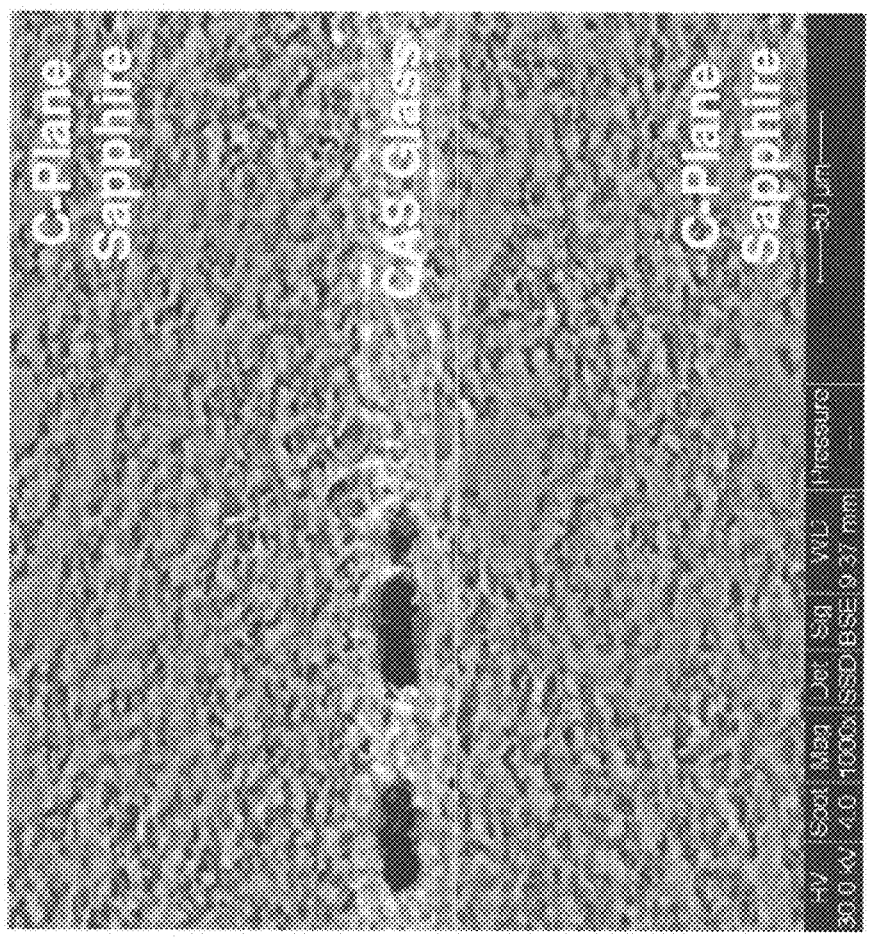

In a separate test, c-plane crystal sapphire window materials were bonded to eutectic materials at a dwell temperature of 1350° C. for 18 hours. The results of this test are shown in FIG. 7A at 71 times magnification and FIG. 7B at 1,000 times magnification. As shown in FIGS. 7A and 7B, at this high dwell temperature, voids in the bonding region were present. These results indicate that a dwell temperature lower than 1350° C. is optimal given the parameters of this example. In one embodiment, a temperature capped at 1300° C., and a duration of longer than 18 hours may be used.

C-plane sapphire has an isotropic coefficient of thermal expansion and exhibits bonding without cracking. When heated, c-plane sapphire expands the same amount in any direction of the plane, allowing for a misalignment of the m- or a-plane as long as the bonding surface is a c-plane. A-plane sapphire has a thermal expansion mismatch in the various directions, requiring better alignment of the c- and m-planes when bonding the a-planes. M-plane sapphire is a mirror plane, and if it is not bonded in the exact orientation of the c- and a-planes of the two windows, the bond will crack upon cooling.

Example 2: A-Plane Bonding Region

A-plane sapphire has a thermal expansion mismatch in the various directions, requiring better alignment of the c-planes and m-planes when bonding the a-planes. As such, a-plane is more orientation dependent and attention to orientation of the mating planes is required. A misorientation of about ±5 degrees of the c- and m-plane can be accommodated without cracking.

Figure 8A:
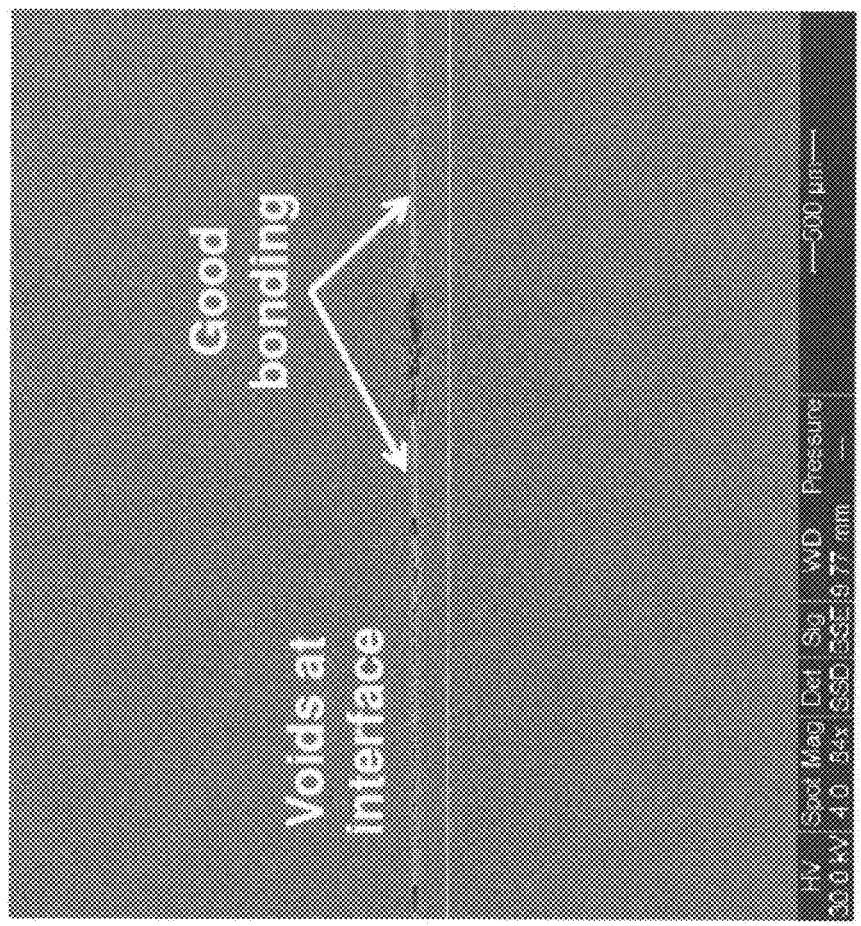
FIGS. 8A and 8B feature two a-plane sapphire bonding region images after exposure to 1325° C. for 20 hours.
Figure 8B:
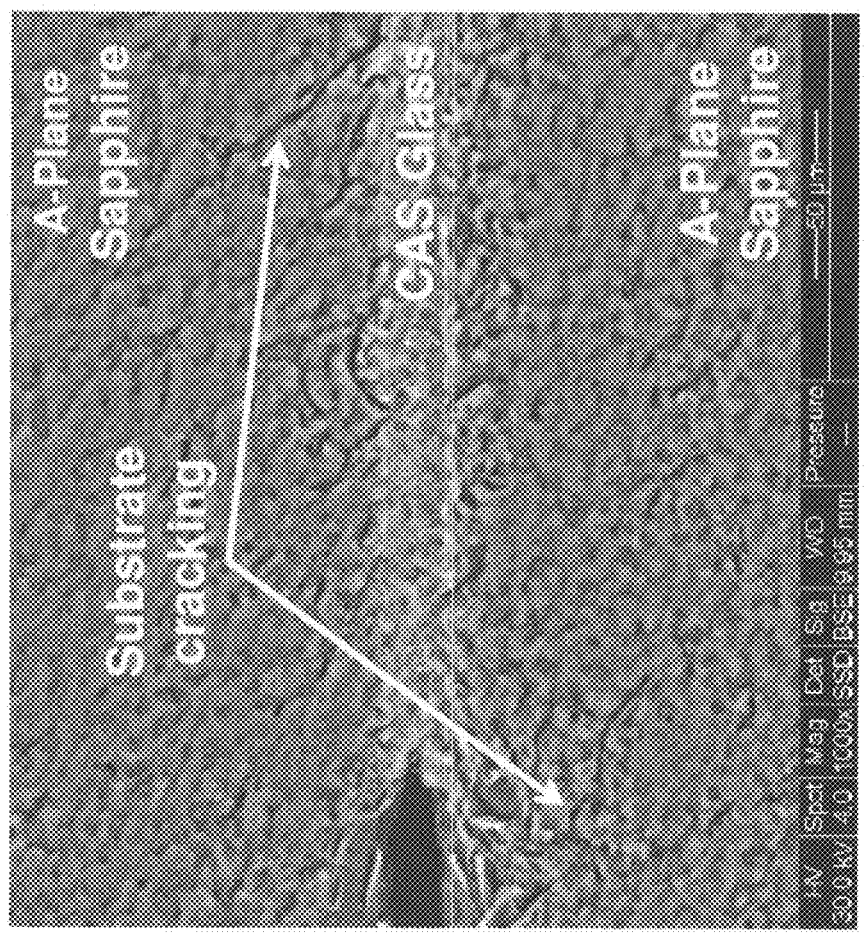

To construct and test the behavior and physical properties of an a-plane crystal sapphire window, a-plane crystal sapphire window material and eutectic material were prepared and combined as discussed above. The window materials 801 and 802 shown in FIG. 8A at 84 times magnification and FIG. 8B at 1,000 times magnification comprise a-plane crystal sapphire. A-plane crystal sapphire is orientation-dependent, and a slight mismatch in orientation results in cracking. In this test, the eutectic material 803 comprises calcium aluminosilicate. The process included heating window materials 801 and 802 and eutectic material 803 at a temperature of 1325° C. for a time duration of 20 hours. As can be seen in FIGS. 8A and 8B, at these conditions, bonding is inconsistent. Good bonding is seen at some points of the bonding region, while voids at the interface are seen in other parts of the bonding region. Further, cracking of the window material 802 is evident. This confirms that a slight mismatch in orientation will result in cracking. X-ray diffraction is used for generating pole figures in order to determine the c- and m-plane orientations within the a-plane.

Example 3: M-Plane Bonding Region

M-plane sapphire is a mirror plane, and if it is not bonded in the exact orientation of the c-planes and a-planes of the two windows, the bond will crack on cooling. M-plane bonds require perfect alignment of the a-plane and c-plane orientations in the m-plane or the bonds will crack. This is often times difficult to achieve and may be impractical. As long as two orthogonal axes can be bonded (e.g., c- and a-planes), then windows can be tiled to achieve the desired larger dimensions. While the c-plane can accommodate slight misorientation, the m-plane cannot accommodate any misorientation.

Figure 9A:
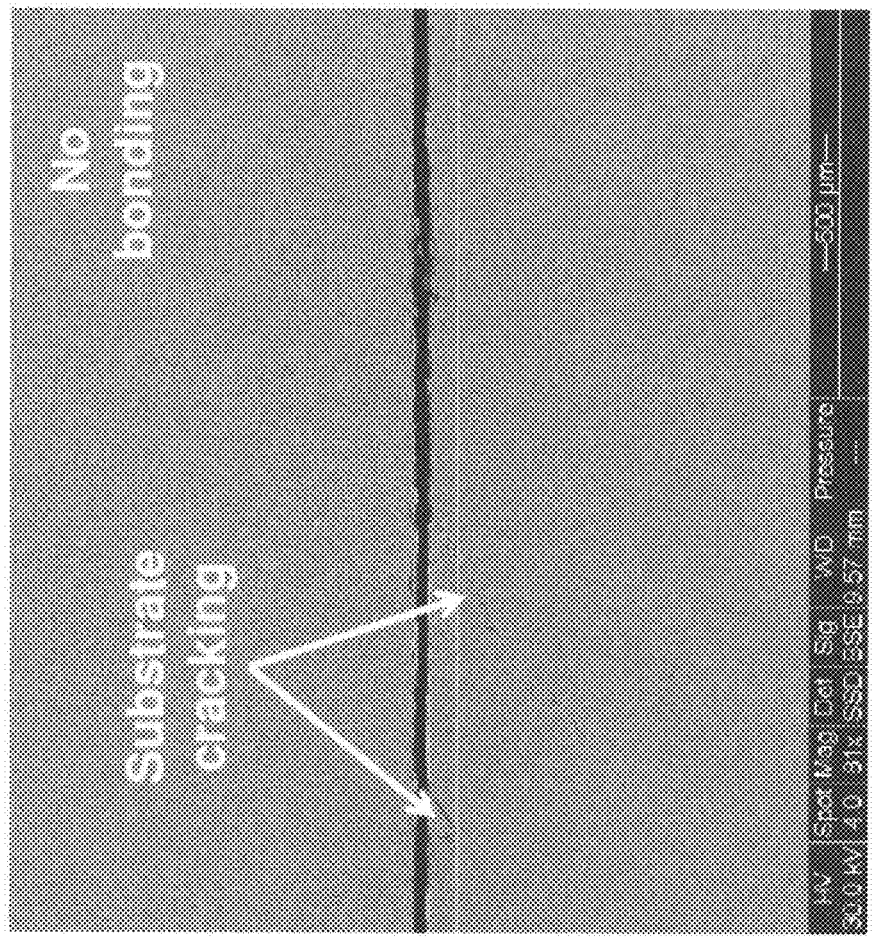
FIGS. 9A and 9B feature two m-plane sapphire bonding region images after exposure to 1325° C. for 20 hours.
Figure 9B:
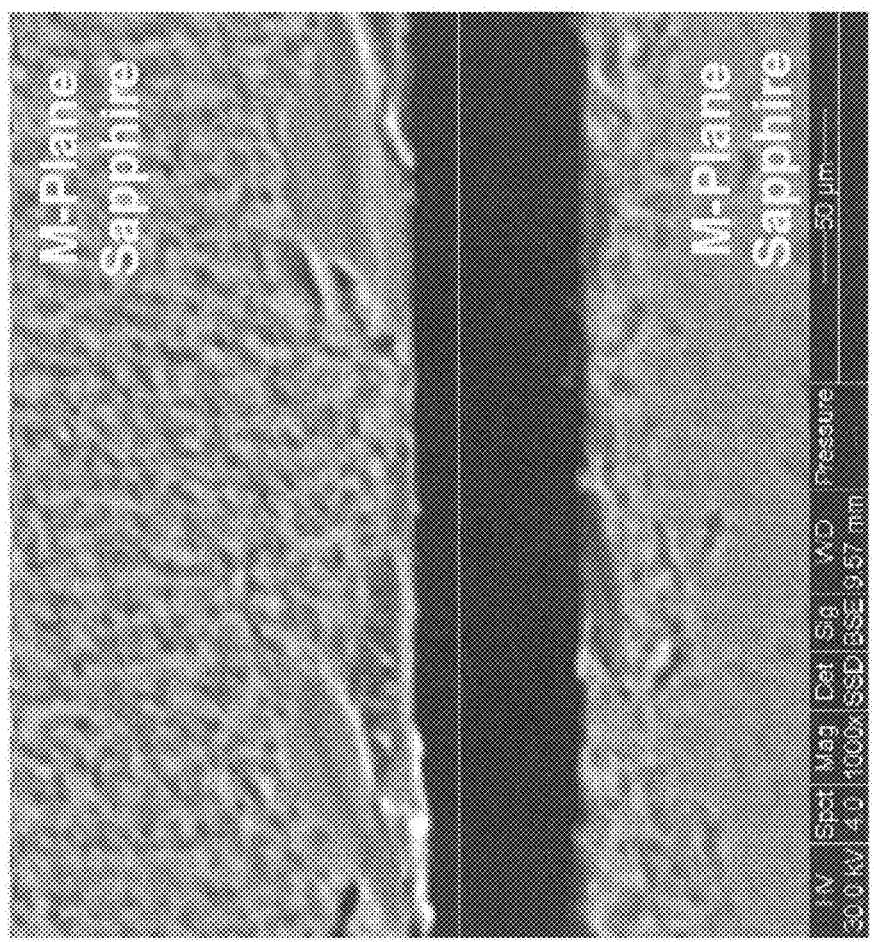

To construct and test the behavior and physical properties of an m-plane crystal sapphire window, m-plane crystal sapphire window material and eutectic material were prepared and combined as discussed above. In this test, window materials 901 and 902 are m-plane crystal sapphire and the eutectic material 903 comprises calcium aluminosilicate. Like the a-plane crystal sapphire discussed above in reference to Example 2, m-plane crystal sapphire is also orientation-dependent. Window materials 901 and 902 and eutectic material 903 were heated at 1325° C. for 20 hours. As can be seen in FIG. 9A at 81 times magnification and FIG. 9B at 1,000 times magnification, at these conditions, no bonding occurs. In addition, cracking can be seen in window material 902. To date, m-plane crystal sapphire window material has been unsuccessful in bonding with calcium aluminosilicate.

Having thus described several aspects of at least one example, it is to be appreciated that various alterations, modifications, and improvements will readily occur to those skilled in the art. For instance, examples disclosed herein may also be used in other contexts. Such alterations, modifications, and improvements are intended to be part of this disclosure, and are intended to be within the scope of the examples discussed herein. Accordingly the foregoing description and drawings are by way of example only.

What is claimed is:
1. A method of forming an optical window comprising:
depositing a layer of eutectic bonding material onto a first surface of a first section of a window material, wherein the eutectic bonding material is an aluminosilicate;

positioning a second surface of a second section of the window material onto the layer of eutectic bonding material such that the first surface is disposed opposite the second surface, the window material being transparent to infrared radiation and including aluminum; and heating the eutectic bonding material to a temperature above a eutectic temperature of the eutectic bonding material and below a melting temperature of the window material for a predetermined length of time to bond the first and second sections together such that at least a portion of the aluminum in the window material diffuses in the form of crystalline needles into an interface between the first section of window material and the eutectic bonding material and the second section of window material and the eutectic bonding material to form an optical window.

2. The method of claim 1, wherein the eutectic bonding material is calcium aluminosilicate (CAS).

3. The method of claim 1, wherein the window material is at least one of Spinel, AlON, sapphire, YAG, Nd:YAG, and SiAlON.

4. The method of claim 3, wherein the window material is sapphire.

5. The method of claim 4, wherein the window material is c-plane sapphire.

6. The method of claim 4, further comprising aligning the crystal orientation of the window material of the first section to the crystal orientation of the window material of the second section.

7. The method of claim 6, wherein the window material is a-plane sapphire.

8. The method of claim 1, wherein the first surface and the second surface are as-ground surfaces.

9. The method of claim 1, wherein the temperature is in a range of 1275-1350° C. and the predetermined length of time is about 18 hours.

10. The method of claim 1, further comprising positioning and heating at least two sections to form a large area format optical window having a size of at least 14 inches×28 inches.

11. The method of claim 1, wherein the second section of the window material is positioned orthogonally relative to the first section of the window material.

12. The method of claim 1, wherein the formed optical window can withstand a tensile load of at least 8 psi.

13. The method of claim 1, wherein the first surface and the second surface are edge surfaces of the first section of the window material and the second section of the window material, respectively.

14. An optical window, comprising:
a first section of a window material having a first surface;
a second section of the window material having a second surface, the window material being transparent to infrared radiation and comprising aluminum; and
at least one layer of eutectic bonding material disposed between the first surface and the second surface, wherein the eutectic bonding material is an aluminosilicate and the first surface is bonded to the second surface using a transient liquid phase bonding process and at least a portion of the aluminum in the window material is integrated as crystalline needles into the an interface between the first section of the window material and the eutectic bonding material and the second section of the second section of the window material and the eutectic bonding material.

15. The optical window of claim 14, wherein the eutectic bonding material is calcium aluminosilicate (CAS).

16. The optical window of claim 14, wherein the window material is at least one of Spinel, AlON, sapphire, YAG, Nd:YAG, and SiAlON.

17. The optical window of claim 16, wherein the window material is sapphire.

18. The optical window of claim 17, wherein the window material is c-plane sapphire or a-plane sapphire.

19. The optical window of claim 14, wherein two or more sections of the window material form a large area format optical window having a size of at least 14×28 inches.

20. The optical window of claim 14, wherein the optical window can withstand a tensile load of at least 8 psi.

* * * * *